(12) United States Patent
Hu et al.

(10) Patent No.: US 6,688,344 B2
(45) Date of Patent: Feb. 10, 2004

(54) CONTAINER FLUSH AND GAS CHARGE SYSTEM AND METHOD

(75) Inventors: Tain-Chen Hu, Pingtung (TW); Ming Te More, Tainan (TW); Wei William Lee, Hsinchu (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 10/159,769

(22) Filed: May 30, 2002

(65) Prior Publication Data

US 2003/0221744 A1 Dec. 4, 2003

(51) Int. Cl.[7] .................................................. B65B 1/04
(52) U.S. Cl. .................................. 141/98; 141/1; 141/8; 141/63; 141/65
(58) Field of Search ............................ 141/1, 8, 63–65, 141/91, 92, 98

(56) References Cited

U.S. PATENT DOCUMENTS

| | | | | |
|---|---|---|---|---|
| 5,879,458 A | * | 3/1999 | Roberson et al. | ............ 118/715 |
| 6,123,120 A | * | 9/2000 | Yotsumoto et al. | ........... 141/65 |
| 6,199,604 B1 | * | 3/2001 | Miyajima | .................... 141/98 |

* cited by examiner

Primary Examiner—J. Casimer Jacyna
(74) Attorney, Agent, or Firm—Tung & Associates

(57) ABSTRACT

A system and method for evacuating potential wafer-corroding and contaminating residual process gases from the interior of a semiconductor wafer pod before, after or both before and after a process is performed on the wafers. The residual process gases are first evacuated from the wafer pod, which is next charged with a fresh supply of inert gas. The system is adapted to evacuate and charge the wafer pod as the wafer pod typically rests on a load port of a SMIF prior to transfer of the pod to another destination in the semiconductor fabrication facility, prior to internalization of the wafers into a processing tool, or both.

19 Claims, 1 Drawing Sheet

CONTAINER FLUSH AND GAS CHARGE SYSTEM AND METHOD

FIELD OF THE INVENTION

The present invention relates to systems for purging containers, and more particularly relates to a container flush and gas charge system and method for evacuating corrosive or contaminating moisture, air, particles or gases from an article container such as a semiconductor wafer pod and charging the container with a fresh supply of inert gas.

BACKGROUND OF THE INVENTION

A standardized mechanical interface (SMIF) system is disclosed in U.S. Pat. Nos. 4,532,970 and 4,534,389. Such a SMIF system is designed to reduce particle fluxes onto semiconductor wafers and/or reticles in a semiconductor production facility. The SMIF system prevents or minimizes particle contamination of the wafers during transport and storage of the wafers by ensuring that gaseous media surrounding the wafers is essentially stationary relative to the wafers, and further, by preventing exposure of the wafers to particles from the ambient environment.

The SMIF concept is based on the use of a small volume of motion- and contamination-controlled, particle-free gas to provide a clean environment for semiconductor wafers and other articles. Further details of one such system are described in a paper entitled, "SMIF: A TECHNOLOGY FOR WAFER CASSETTE TRANSFER IN VLSI MANUFACTURING", by Mihir Parikh and Ulrich Kaempf, Solid State Technology, July 1984, pp. 111–115.

SMIF systems are designed to prevent contamination by particles which range from below 0.02 $\mu$m to above 200 $\mu$m. Due to the small geometries of the components in modern semiconductor integrated circuits, particles falling within this size range can significantly adversely affect semiconductor processing. Current geometry sizes for semiconductor integrated circuits have reached less than half a micron, and those circuits are adversely affected by particles having a size as small as 0.01 $\mu$m. In the future, semiconductor integrated circuits will be marked by increasingly smaller geometry sizes, requiring protection from contamination by correspondingly smaller particles.

In a typical SMIF system, semiconductor wafers are stored and transported in wafer cassette containers, or pods, and are transferred from the pod to processing equipment typically in the following manner. First, the pod is placed at the interface port of a processing tool. Each pod includes a box and a box door designed to mate with doors on the interface ports of the processing equipment enclosures. Then, latches release the box door, and the box door and the interface port door are opened simultaneously such that particles which may have adhered to the external door surfaces are trapped or sandwiches between the box and interface port doors. A mechanical elevator lowers or translates the two doors, with the cassette riding on top, into the enclosure-covered space. The cassette is transferred by gravity or a manipulator and placed onto the cassette platform of the equipment. After processing, the reverse operation takes place.

FIG. 1 illustrates a load port configuration which utilizes a SMIF 10 such as an indexer to transfer a wafer cassette 22 carrying multiple semiconductor wafers 24 from a SMIF pod 16 to a process tool (not illustrated), such as an etcher, for example, and from the process tool back to the SMIF pod 16. In this type of load port configuration, the SMIF pod 16 is first loaded onto the load port 11 of the indexer 10, typically from an overhead transport vehicle (OHT) or automatic guided vehicle (AGV), with the bottom pod door 20 of the SMIF pod 16 initially attached to the shell 18 thereof and resting on the port door 12 of the load port 11. As the port door 12 is lowered into the SMIF 10, the shell 18 of the SMIF pod 16 remains at the load height (typically 900 mm) at the level of the port plate 14 of the load port 11. Simultaneously, the pod door 20 resting on the port door 12 is uncoupled from the shell 18 and the cassette 22 containing the wafers 24 is lowered with the supporting port door 12 into a minienvironment beneath the SMIF 10. From the minienvironment, the cassette 22 and/or wafers 24 are transferred to and from the process tool for processing of the wafers 24. After wafer processing, the cassette 22 holding the processed wafers 24 is transferred back to the port door 12 of the SMIF 10, and the port door 12 is raised and lifts the cassette 22 back into the shell 18 and replaces the pod door 20 on the shell 18. The re-assembled SMIF pod 16 is then removed and transported either manually or by an OHT or AGV to another location for further processing.

One of the problems frequently encountered in operation of the SMIF load port configuration 10 is that residual corrosive process gases from the process tool tend to become recaptured in the shell 18 of the SMIF pod 16 when the pod door 20 is raised back in place on the shell 18 by the port door 12. This tendency is particularly problematic in ballroom-type cleanrooms in which an inert gas is not discharged into the SMIF pod 16 after wafer processing to dispel the residual process gases in the SMIF pod 16. Exposure of the encapsulated wafers 24 to corrosive gases in the SMIF pod 16 during subsequent transfer to the next processing tool tends to induce corrosion and contamination of the wafers, as well as shorten wafer Q-time and adversely affect wafer yield performance.

SUMMARY OF THE INVENTION

Accordingly, an object of the present invention is to provide a system for controlling the interior environment of an article-carrying container to prevent corrosion of articles in the container.

Another object of the present invention is to provide a system which is capable of purging corrosive gases from an article-carrying container in a manufacturing or other facility.

Another object of the present invention is to provide a system which is capable of restoring an inert gas to a semiconductor wafer pod to prevent or reduce the incidence of corrosion or contamination of semiconductor wafers stored or transported in the pod.

Still another object of the present invention is to provide a system which is capable of evacuating corrosive gases and potential contaminants from a wafer cassette container or pod and restoring a desired gaseous environment inside the wafer cassette container or pod.

Yet another object of the present invention is to provide a method for the purging of potential corrosive residual process gases from a semiconductor wafer pod interior and restoring a normal clean, inert gaseous environment inside the pod to minimize yield contamination and corrosion of semiconductor wafers transferred in a semiconductor production facility.

In accordance with these and other objects and advantages, the present invention comprises a system and method for evacuating potential wafer-corroding and contaminating residual process gases from the interior of a semiconductor wafer pod before, after or both before and after a process is performed on the wafers. The residual process gases are first evacuated from the wafer pod, which is next charged with a fresh supply of inert gas. The system is adapted to evacuate and charge the wafer pod as the wafer pod typically rests on a load port of a SMIF prior to transfer of the pod to another destination in the semiconductor fabrication facility, prior to internalization of the wafers into a processing tool, or both.

According to a typical embodiment of the present invention, a vacuum/exhaust line communicates with the pod interior to remove residual process gas from the pod interior as the pod contains a wafer-filled cassette and rests typically on a load port of a SMIF before internalization of the wafers or wafer-filled cassette into a processing tool such as an etcher, for example, or transfer of the wafer-filled pod from the SMIF to a processing tool or other destination in the clean room or facility. An inert gas supply line communicates with the pod interior and extends from an inert gas source for introducing a fresh supply of inert gas into the pod after the evacuation step. The system can be operated to evacuate the pod and charge the pod with a fresh supply of inert gas before, after, or both before and after the process is performed on the wafer.

According to a typical embodiment of the present invention, the removable bottom door of the pod is modified to establish fluid communication between the pod interior and the gas supply line and the vacuum/exhaust line, respectively, of the system. The pod door and the inert gas supply line and vacuum/exhaust line may each be provided with quick connect/disconnect couplings to facilitate quick and easy, removable attachment of the pod to the gas supply line and the vacuum/exhaust line, respectively. The gas supply line and vacuum/exhaust line may extend through an elevatable port door on the SMIF, wherein one set of the quick connect/disconnect couplings are located on the port door and the other set of companion quick connect/disconnect couplings are provided on the pod door. Accordingly, the interior of the wafer pod is disposed in fluid communication with the gas supply line and the vacuum/exhaust line when the wafer pod is supported on the port door of the SMIF.

A pair of valves may be provided in the gas supply line and the vacuum/exhaust line, respectively, for controlling flow of inert gas through the gas supply line and establishing or dissipating vacuum pressure in the vacuum/exhaust line, respectively. An interface circuit may be provided in the system for receiving a signal from the SMIF controller and facilitating implementation of the evacuating step and the gas charging step, respectively, by controlling the valves, prior to removal of the wafer cassette from the pod, after replacement of the wafer cassette in the pod, or both.

BRIEF DESCRIPTION OF THE DRAWINGS

The present invention will now be described, by way of example, with reference to the accompanying drawings, in which.

DESCRIPTION OF THE EMBODIMENTS

When used herein, the term "container" shall include any container capable of storing or transferring semiconductor wafers or any other objects. When used herein, the term "connector" shall include any mechanism or device capable of connecting one element to another element, including but not limited to quick connect/disconnect couplings. When used herein, the term, "fluid" shall include any inert fluid. When used herein, the term, "vacuum pump" shall mean any mechanism, system or device capable of initiating and sustaining vacuum pressure in a vessel.

The present invention has particularly beneficial utility in restoring a desired gaseous composition inside a wafer pod or container used in the storage and transfer of semiconductor wafers in the semiconductor fabrication industry. However, the invention is not so limited in application and while references may be made to such wafer pods or containers, the present invention may be more generally applicable to container evacuation and charging in a variety of product and industrial applications.

Figure 2:
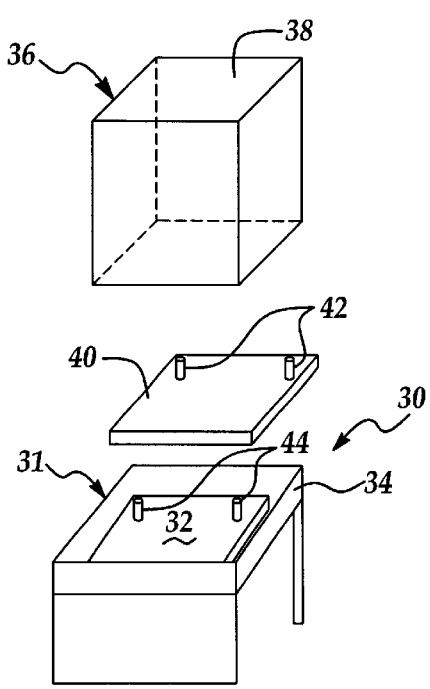
FIG. 2 illustrates a SMIF and SMIF pod in implementation of the present invention.
Figure 3:
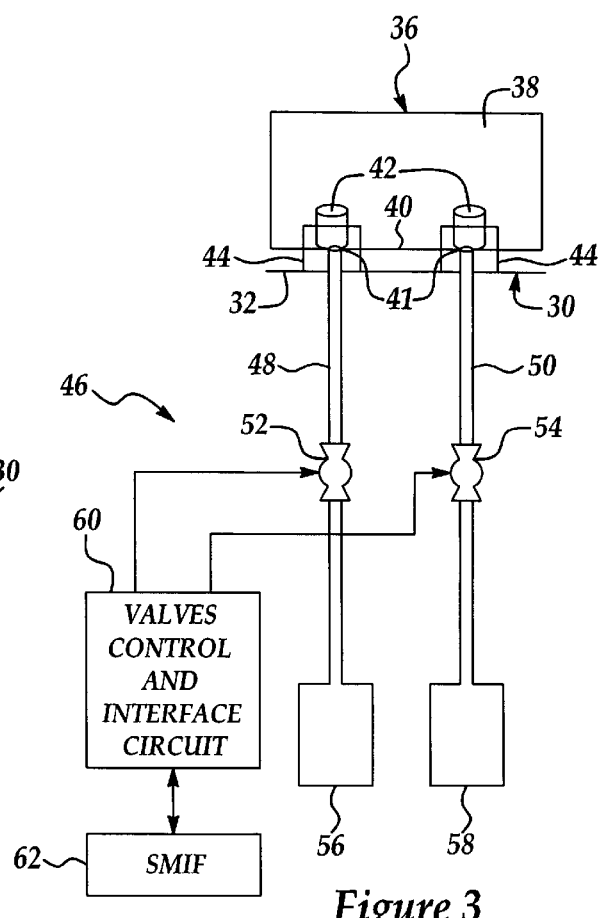
FIG. 3 schematically illustrates a system of the present invention.

A container flush and gas charge system of the present invention is generally indicated by reference numeral 46 in FIG. 3 and typically includes a SMIF (standard mechanical interface) 30 such as an indexer, illustrated in FIG. 2, in combination with a SMIF pod 36 having a shell 38 and a removable pod door 40 closing the bottom of the shell 38. The attachment mechanism for the pod door 40 on the shell 38 may be conventional. The SMIF 30 typically includes a load port 31, having a port plate 34 and fitted with an elevatable port door 32 inside the load port 31. An SMIF controller 62 may be operably connected to the SMIF 30 to facilitate automatically raising and lowering the port door 32 in the load port 31 according to data programmed into the SMIF controller 62. As illustrated in FIG. 3, a gas supply line 48 and a vacuum/exhaust line 50, connected in fluid communication with an inert gas source 56 and a vacuum pump 58, respectively, typically extend upwardly through respective openings (not illustrated) provided in the port door 32 of the SMIF 30. The inert gas source 56 contains a supply of a pressurized inert gas such as nitrogen.

Quick connect/disconnect couplings 44 are provided on the upper ends of the inert gas supply line 48 and vacuum/exhaust line 50, respectively. The quick connect/disconnect couplings 44 may be incorporated into the port door 32 of the SMIF 30, or alternatively, separate therefrom. A pair of spaced-apart openings 41 is provided in the bottom pod door 40 of the SMIF pod 36, and quick connect/disconnect couplings 42 are provided on the pod door 40 at the respective openings 41. Accordingly, the quick connect/disconnect couplings 42 on the pod door 40 removably engage the respective quick connect/disconnect couplings 44 on the respective gas supply line 48 and vacuum/exhaust line 50 when the SMIF pod 36 is supported on the port door 32, as illustrated in FIG. 3. The quick connect/disconnect couplings 44, 42 maintain the gas supply line 48 and vacuum/exhaust line 50 in fluid communication with the interior of the shell 38 when the SMIF pod 36 is supported on the port door 32, and are disconnected from each other either manually or automatically before removal of the SMIF pod 36 from the port door 32, in operation of the system 46 as hereinafter further described. Preferably, the quick connect/disconnect couplings 42 seal the openings 41 in the pod door 40 upon disconnection from the respective quick connect/disconnect couplings 44.

As further illustrated in FIG. 3, a solenoid-controlled pneumatic gas line valve 52 and a solenoid-controlled pneumatic exhaust line valve 54 are provided in the gas supply line 48 and the vacuum/exhaust line 50, respectively, and may be operably connected to a valve control and interface circuit 60 which interfaces with the SMIF controller 62. When in the open configuration, the exhaust line valve 54 establishes vacuum pressure in the vacuum/exhaust line 50 between the vacuum pump 58 and the SMIF pod 36, such that the gaseous contents of the SMIF pod 36 are evacuated therefrom through the vacuum/exhaust line 50. Conversely, when closed, the exhaust line valve 54 dissipates vacuum pressure in the vacuum/exhaust line 50 and SMIF pod 36. When open, the gas line pneumatic valve 52 facilitates flow of inert gas from the gas source 56, through the gas supply line 48 and into the SMIF pod 36, and terminates flow of inert gas through the gas supply line 48 and into the SMIF pod 36 when closed. In operation of the system 46 as hereinafter described, the SMIF controller 62, via the valve control and interface circuit 60, first initiates evacuation of corrosive process gases from the SMIF pod 36, through the vacuum/exhaust line 50 and to the vacuum pump 58 and a suitable gas disposal or vent system (not illustrated) by opening the exhaust line valve 54. After it then closes the exhaust line valve 54, the valve control and interface circuit 60 opens the gas line valve 52, thereby facilitating flow of inert gas from the gas source 56, through the gas supply line 48 and open gas line valve 52, and into the SMIF pod 36.

Figure 1:
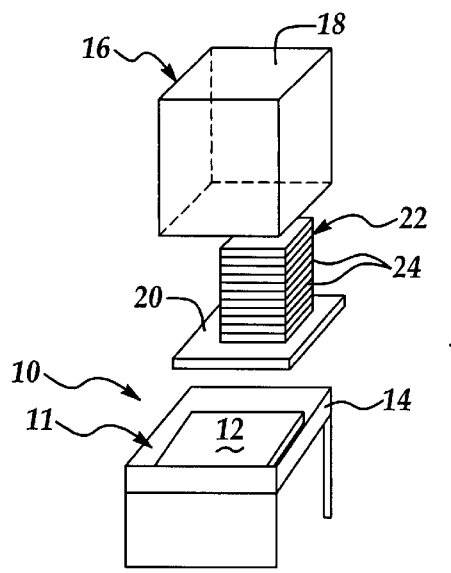
FIG. 1 illustrates a conventional SMIF (standard mechanical interface) and SMIF pod containing a wafer cassette holding multiple semiconductor wafers, with the pod door removed from the shell of the SMIF pod in a typical procedure for internalizing the wafer cassette into the SMIF prior to processing of the wafers.

In typical operation of the system 46, the SMIF pod 36, sealed by the pod door 40 and containing a wafer cassette 22 (FIG. 1) which holds multiple WIP (work in progress) semiconductor wafers 24, is delivered to the SMIF 30 typically by operation of an overhead transport vehicle (OHT) or automatically guided vehicle (AGV). A robot (not illustrated) typically removes the SMIF pod 36 from the OHT or AGV and places the SMIF pod 36 on the SMIF 30, with the pod door 40 supported on the port door 32 of the load port 31. Accordingly, the quick connect/disconnect couplings 42 on the pod door 40 removably engage the respective companion quick connect/disconnect couplings 44 on the port door 32, such that the gas supply line 48 and vacuum/exhaust line 50 are disposed in fluid communication with the interior of the SMIF pod 36 inside the shell 38 thereof. As the valve control and interface circuit 60 under direction of the SMIF controller 62 maintains the gas line valve 52 and exhaust line valve 54 in the closed position, the SMIF controller 62 lowers the port door 32 of the SMIF 30 into the load port 31. Simultaneously, the shell 38 of the SMIF pod 36 remains at the load height, typically 900 mm, at the level of the port plate 34 of the load port 31 while the pod door 40 resting on the port door 32 is uncoupled from the shell 38 and the cassette 22 (FIG. 1) containing the wafers 24 is lowered with the supporting port door 32 into a minienvironment (not illustrated) beneath the SMIF 30. From the minienvironment, the cassette 22 and/or wafers 24 are transferred to and from the process tool for processing of the wafers 24. After wafer processing, the cassette 22 holding the processed wafers 24 is transferred back to the port door 32 of the SMIF 30. The SMIF controller 62 raises the port door 32, which lifts the cassette 22 back into the shell 38 and replaces the pod door 40 on the shell 38.

After it is replaced on the shell 38, the pod door 40 remains attached to the underlying port door 32 of the SMIF 30 by operation of the quick connect/disconnect couplings 42, 44. At that time, the SMIF controller 62 actuates the valve control and interface circuit 60 to open the exhaust line valve 54. Accordingly, vacuum pressure is induced in the vacuum/exhaust line 50 along the entire length thereof by operation of the vacuum pump 58, as well as the shell 38 of the SMIF pod 36. Consequently, residual process gases captured in the SMIF pod 36 upon previous replacement of the pod door 40 on the shell 38 are evacuated from the re-assembled SMIF pod 36 through the vacuum/exhaust line 50 and open exhaust line valve 54, and are disposed of or vented in a suitable manner. Typically, vacuum pressure is applied to the interior of the SMIF pod 36 for a period of about 20–60 seconds. Responsive to signaling from the SMIF controller 62, the valve control and interface circuit 60 next closes the exhaust line valve 54 to dissipate vacuum pressure in the vacuum/exhaust line 50 and SMIF pod 36 and then opens the gas line valve 52 to facilitate flow of inert gas from the gas source 56, through the gas supply line 48 and open gas line valve 52, and into the SMIF pod 36 at a selected pressure, typically about 20–100 p.s.i. and for about 20–60 sec. This step substantially restores the inert gas composition inside the SMIF pod 36 and thus, prevents corrosion and/or contamination of the wafers 24 therein which may otherwise be caused by residual process gases remaining in the SMIF pod 36. Next, the re-assembled and charged SMIF pod 36 is removed from the SMIF 30, at which time the quick connect/disconnect couplings 42 on the SMIF pod 36 disengage the respective quick connect/disconnect couplings 44 on the SMIF 30. Upon release, the quick connect/disconnect couplings 42 seal the openings 41 in the pod door 40 to prevent escape of the inert charge gas from the SMIF pod 36 and entry of moisture, ambient air, particles and other corrosive or contaminating agents into the SMIF pod 36. The SMIF pod 36 is finally transported either manually or by an OHT or AGV to another location for further processing.

It is understood that the SMIF pod 36 may be charged with a fresh supply of inert gas before internalization of the pod door 40, wafer cassette 22 and wafers 24 through the load port 31 of the SMIF 30, as desired. This is accomplished by initial placement of the SMIF pod 36 on the port door 32, followed by operation of the exhaust line valve 54 and gas line valve 52, respectively, to evacuate and charge, respectively, the interior of the SMIF pod 36 in the manner heretofore described. The SMIF controller 62 is then operated to lower the port door 32 into the load port 31 to withdraw the wafer cassette 22 and wafers 24 through the SMIF 30 and to the processing tool (not illustrated). After processing of the wafers 24 and encapsulation of the wafers 24 and wafer cassette 22 in the SMIF 30, the SMIF 30 is again evacuated and charged as heretofore described to remove residual process gases therefrom and restore the desired inert gas environment therein.

While the preferred embodiments of the invention have been described above, it will be recognized and understood that various modifications can be made in the invention and the appended claims are intended to cover all such modifications which may fall within the spirit and scope of the invention.

Having described our invention with the particularity set forth above, we claim:

1. A system for evacuating a container and charging the container with a fluid, comprising:
   a fluid source;
   a first quick connect/disconnect coupling for removably connecting the container to said fluid source;
   a vacuum pump;
   a second quick connect/disconnect coupling for removably connecting the container to said vacuum pump;
   a first valve provided between said fluid source and said first coupling and a second valve provided between said vacuum pump and said second coupling; and a controller operably connected to said first valve and said second valve for opening and closing said first valve and said second valve.

2. The system of claim 1 wherein said fluid source comprises an inert gas source.

3. The system of claim 1 further comprising a load port having a port door for receiving the container and a container door for removably engaging the container, and wherein said first quick connect/disconnect coupling comprises a first coupling element provided on said port door and a second coupling element provided on said container door for removably engaging said first coupling element, and second quick connect/disconnect coupling comprises a third coupling element provided on said port door and a fourth coupling element provided on said container door for removably engaging said third coupling element.

4. The system of claim 3 wherein said fluid source comprises an inert gas source.

5. The system of claim 1 further comprising a fluid supply line disposed between said fluid source and said first quick connect/disconnect coupling and a vacuum/exhaust line disposed between said vacuum pump and said second connector.

6. The system of claim 5 wherein said fluid source comprises an inert gas source.

7. The system of claim 5 further comprising a load port having a port door for receiving the container and a container door for removably engaging the container, and wherein said first quick connect/disconnect coupling comprises a first coupling element provided on said port door and a second coupling element provided on said container door for removably engaging said first coupling element, and second quick connect/disconnect coupling comprises a third coupling element provided on said port door and a fourth coupling element provided on said container door for removably engaging said third coupling element.

8. The system of claim 7 wherein said fluid source comprises an inert gas source.

9. A system for operation in conjunction with a standard mechanical interface device to evacuate a container and charge the container with a fluid, comprising:

a container door for removably closing the container, said container door having a first opening and a second opening;

a fluid source;

a first connector for removably connecting said fluid source to said container door in fluid communication with said first opening;

a vacuum pump;

a first valve provided between said fluid source and said first connector;

a second connector for removably connecting said vacuum pump to said container door in fluid communication with said second opening;

a second valve provided between said vacuum pump and said second connector;

a valve control interface circuit connected to said first valve and said second valve; and a controller operably connected to said first valve and said second valve through said valve control interface circuit for opening and closing said first valve and said second valve and operating the standard mechanical interface device.

10. The system of claim 9 wherein said fluid source comprises an inert gas source.

11. The system of claim 9 wherein said first connector comprises a first quick connect/disconnect coupling and said second connector comprises a second quick connect/disconnect coupling.

12. The system of claim 11 wherein said fluid source comprises an inert gas source.

13. The system of claim 9 wherein said first valve a and said second valve each comprises a solenoid valve.

14. The system of claim 13 wherein said fluid source comprises an inert gas source.

15. The system of claim 13 wherein said first connector comprises a first quick connect/disconnect coupling and said second connector comprises a second quick connect/disconnect coupling.

16. The system of claim 15 wherein said fluid source comprises an inert gas source.

17. A method of evacuating a container and charging the container with a fluid in conjunction with operating a standard mechanical interface device having a controller, comprising the steps of:

providing a fluid source;

providing a vacuum pump;

providing a first valve in fluid communication with said fluid source and a second valve in fluid communication with said vacuum pump;

operably connecting said controller of said standard mechanical interface device to said first valve and said second valve for opening and closing said first valve and said second valve;

removably providing said container in fluid communication with said fluid source and said vacuum pump;

evacuating said container by operating said vacuum pump and opening said second valve using said controller; and distributing the fluid from said fluid source into said container by closing said second valve and opening said first valve using said controller.

18. The method of claim 17 further comprising the steps of:

providing a valve control and interface circuit between said controller and said first valve and said controller and said second valve.

19. The method of claim 17 further comprising the steps of providing a first quick connect/disconnect coupling and a second quick connect/disconnect coupling, and wherein said removably providing said container in fluid communication with said fluid source comprises removably providing said container in fluid communication with said fluid source by operation of said first quick connect/disconnect coupling and said removably providing said container in fluid communication with said vacuum pump comprises removably providing said container to in fluid communication with said vacuum pump by operation of said second quick connect/disconnect coupling.

* * * * *